(12) United States Patent
Geiss et al.

(10) Patent No.: US 11,549,564 B2
(45) Date of Patent: Jan. 10, 2023

(54) OSCILLATION DAMPER, IN PARTICULAR FOR A SWITCH CABINET

(71) Applicant: FRAMATOME GmbH, Erlangen (DE)

(72) Inventors: Manfred Geiss, Lich (DE); Nadim Moussallam, Erlangen (DE)

(73) Assignee: FRAMATOME GmbH, Erlangen (DE)

( * ) Notice: Subject to any disclaimer, the term of this patent is extended or adjusted under 35 U.S.C. 154(b) by 352 days.

(21) Appl. No.: 16/756,718

(22) PCT Filed: Oct. 16, 2018

(86) PCT No.: PCT/EP2018/078209
§ 371 (c)(1),
(2) Date: Apr. 16, 2020

(87) PCT Pub. No.: WO2019/076879
PCT Pub. Date: Apr. 25, 2019

(65) Prior Publication Data
US 2020/0292023 A1 Sep. 17, 2020

(30) Foreign Application Priority Data
Oct. 18, 2017 (DE) .......................... 102017218641.0

(51) Int. Cl.
*F16F 7/116* (2006.01)
*F16F 15/14* (2006.01)
(Continued)

(52) U.S. Cl.
CPC ................ *F16F 7/116* (2013.01); *F16F 7/14* (2013.01); *F16F 15/06* (2013.01); *F16F 15/1414* (2013.01); *H05K 7/18* (2013.01)

(58) Field of Classification Search
USPC ....... 248/562, 564, 566, 569, 570, 571, 574, 248/576, 638
See application file for complete search history.

(56) References Cited

U.S. PATENT DOCUMENTS

| 4,343,452 A | * | 8/1982 | Bauer | ..................... D06F 37/22 248/619 |
| 4,736,701 A | | 4/1988 | Kondo et al. | |

(Continued)

FOREIGN PATENT DOCUMENTS

| CN | 104819239 A | 8/2015 |
| DE | 69303039 T2 | 12/1996 |

(Continued)

*Primary Examiner* — Alfred J Wujciak
(74) *Attorney, Agent, or Firm* — Davidson, Davidson & Kappel, LLC (57) ABSTRACT

A passive oscillation damper (8), in particular for a switch cabinet (2), includes a supporting structure (12) having a longitudinal direction (y) and a transverse direction (x) and with a central oscillating mass (14) mounted by means of spring elements (20, 22, 24, 26) so as to be able to oscillate in the longitudinal direction (y) and in the transverse direction (x). At least one peripheral oscillating mass (40, 42) is mounted on the central oscillating mass (14) so as to be slidable in the longitudinal direction (y) and to be movable relative to the central oscillating mass (14). At least one peripheral oscillating mass (44, 46) is mounted on the central oscillating mass (14) so as to be slidable in the transverse direction (x) and to be movable relative to central oscillating mass (14).

20 Claims, 5 Drawing Sheets

(51) Int. Cl.
*F16F 7/14* (2006.01)
*F16F 15/06* (2006.01)
*H05K 7/18* (2006.01)

(56) References Cited

U.S. PATENT DOCUMENTS

| | | | |
|---|---|---|---|
| 5,441,129 | A | 6/1995 | Sakamoto et al. |
| 5,716,037 | A | 2/1998 | Haak |
| 2001/0022256 | A1 | 9/2001 | Misaji et al. |
| 2004/0195742 | A1* | 10/2004 | Wood ................. F16F 7/116 267/140.14 |
| 2007/0119794 | A1 | 5/2007 | Hidaka et al. |
| 2013/0075209 | A1 | 3/2013 | Semura et al. |
| 2016/0123422 | A1 | 5/2016 | Keinanen et al. |
| 2020/0318625 | A1* | 10/2020 | Lucon ................. F04B 39/0044 |
| 2022/0060022 | A1* | 2/2022 | Abaitancei ................. F15B 1/04 |

FOREIGN PATENT DOCUMENTS

| | | |
|---|---|---|
| EP | 0204330 A2 | 12/1986 |
| KR | 1020110108913 A | 10/2011 |
| WO | WO2005005857 A1 | 1/2005 |
| WO | WO2014195575 A1 | 12/2014 |
| WO | WO2016132394 A2 | 8/2016 |

\* cited by examiner

OSCILLATION DAMPER, IN PARTICULAR FOR A SWITCH CABINET

The invention relates to an oscillation damper and a switch cabinet with such an oscillation damper.

BACKGROUND

Oscillation absorbers which are fastened to an object in order to protect said object with respect to a massive oscillation excitation, for example, by seismic or other influences (in particular impact of other objects) are referred to as oscillation dampers. Such an oscillation damper, which is also referred to in the English language area as "tuned mass damper," usually has, as main elements, a mass mounted so as to be able to oscillate, in short, an oscillating mass and associated spring elements and damper elements, which enable a damped oscillation of the oscillating mass relative to the object to be protected. The design of the mentioned components is thereby such that a natural frequency of the object, which is critical with respect to the expected load case, is suppressed in the overall system formed by the object and the oscillation damper or is shifted into non-critical areas. Thus, a damping of the overall system at the excitation frequency is achieved. Design parameters are thereby above all the mass (weight), the spring stiffness and the damping (dissipation).

An oscillation damper is known from KR 10-2011-0108913 A, which is mounted on a switch cabinet of a nuclear power plant, in order to protect the electrical or electronic components located therein in the event of seismic excitation or in the case of other induced oscillations from excessive loading due to acceleration forces. This is important, in particular, in the case of an I&C switch cabinet, which contains components of the power plant control (I&C=Instrumentation and Control).

The oscillation damper disclosed there has an oscillating mass arranged in a square box at a distance to the edge and mounted with low friction on balls. A plurality of coil springs, which are tensioned between the oscillating mass and the edge of the box, brings about a reset into the rest position when the oscillating mass is laterally deflected. The coil springs are compressed and stretched when the system oscillates in the longitudinal direction. The damping of the oscillation is thereby achieved by viscous oscillation dampers, which are clamped parallel to the coil springs between the oscillating mass and the edge of the surrounding box.

Typically, a switch cabinet has a rectangular cross section and has different natural oscillation modes in relation to the longitudinal direction and the transverse direction. In the case of the mentioned oscillation damper according to KR 10-2011-0108913 A a certain adaptation can indeed be made by setting or selecting different spring stiffnesses and damping constants for the transverse- and the longitudinal direction, however, in practice this adaptation is frequently insufficient. Moreover, the viscous oscillation dampers require a regular inspection and maintenance.

SUMMARY

The problem addressed by the present disclosure is to indicate a low-maintenance and robust oscillation damper of the type mentioned, which can be adapted particularly flexibly to different modes in different spatial directions, and which thus brings about an effective reduction of seismic and similar oscillation excitations, in particular, when used at/on a switch cabinet.

Accordingly, a passive oscillation damper is provided, in particular for a switch cabinet, with a supporting structure having a longitudinal and a transverse direction and a central oscillating mass which is mounted so as to be able to oscillate in the longitudinal and transverse direction by means of spring elements, wherein at least one peripheral oscillating mass is mounted on the central oscillating mass so as to be slidable in the longitudinal direction and to be movable relative to the central oscillating mass, and wherein a peripheral oscillating mass is mounted on the central oscillating mass so as to be slidable in the transverse direction and is movable relative to central oscillating mass.

The term "mounted so as to be slidable" is to be understood here and below in a broad sense and also comprises a rolling support, for example, with the aid of ball bearings.

Advantageous embodiments result from the dependent claims and from the following description in conjunction with the associated drawings.

The present disclosure is based on the consideration that a switch cabinet has different main oscillation modes with different natural frequencies in the horizontal longitudinal- and transverse direction (hereinafter: x- and y-direction). In order to achieve an optimal oscillation damping, therefore actually two oscillation dampers with correspondingly differently set damping characteristics would need to be arranged above one another on the switch cabinet, which would lead to an undesired high total weight and space requirement.

The present disclosure therefore takes a different path, in that it provides a central (inner) oscillating mass, which can perform oscillations in both directions around a resting position, and at least two peripheral (outer) oscillating masses. At least one of the peripheral oscillating masses can oscillate only in the x-direction, wherein the central oscillating mass accordingly is moved with it in the x-direction, but can move independently in the y-direction. The coupling is preferably realized by mounting the mentioned peripheral oscillating mass on a correspondingly arranged guiding element of the central oscillating mass such that it is slidable in the y-direction. In addition, a sliding guide of the peripheral oscillating mass is provided in the direction normal thereto, therefore in the x-direction, through guiding elements arranged on the supporting structure. At least one further peripheral oscillating mass has, in an analogue manner, a degree of freedom of movement in the y-direction realized by corresponding guiding elements on the supporting structure. By means of a sliding bearing on a guiding element of the central oscillating mass, the same is coupled in the y-direction to the movement of the mentioned peripheral oscillating mass, while it is independently movable relative to it in the x-direction.

Particularly preferred is a cross-shaped symmetrical arrangement with two peripheral oscillating masses movable exclusively in the x-direction, two peripheral oscillating masses movable exclusively in the y-direction and the central oscillating mass in the middle there-between movable relative to the supporting structure in both directions.

Each of the peripheral oscillating masses is coupled via at least one spring element to the surrounding supporting structure and is thus subjected to a resetting force in the direction towards the resting position. Preferably, each peripheral oscillating mass is coupled to the supporting structure via two spring elements arranged symmetrically to it. In the case of the preferably four peripheral oscillating masses, four groups of two spring elements each are therefore preferably used, in total, therefore, eight spring elements. Due to the already mentioned coupling of the peripheral oscillating masses to the central oscillating mass, the central oscillating mass is subjected to a resetting force in the direction towards the resting position. At the same time, the spring elements act in an oscillation-damping manner.

It can also be expressed in such a manner that the central oscillating mass, which is preferably dominant from the point of view of weight can carry out oscillations in both directions about a resting position—with always constant orientation—while the first group of peripheral oscillating masses, which are usually lighter in comparison to the central oscillating mass, is forcibly moved with it in the x-direction, but retains its y-position, and vice versa for the second group. The associated spring elements are stressed and the desired resetting forces are generated by the forced co-movement of the respective peripheral oscillating mass.

By the setting of the masses effective in the respective direction and by the selection of the associated spring stiffnesses, a differential setting of the oscillation behaviour in both directions can take place. Thus, in a simple manner and with a minimum number of different spring types an optimal adaptation to the different natural frequencies to be eliminated can take place in both directions. A setting in the x-direction by means of the corresponding peripheral masses and spring elements is completely independent of the setting in the y-direction, therefore does not detune the latter, and vice versa. Since the main mass, namely, the central oscillating mass, acts in relation to the overall system in both directions in an oscillation-damping manner, the total weight of the oscillation damper is comparatively low.

The spring elements are preferably springs made from steel wire or steel rope(s) coiled or wound helically about a longitudinal axis, in short, steel wire springs or wire steel springs or wire rope springs, which are arranged in such a manner that, viewed in cross section, they are subjected to tensile or compressive forces in the radial direction. The forces therefore act on it substantially perpendicular to the longitudinal axis of the respective spring. Thus, a particularly compact design can be realized with sufficiently large spring paths. Wire rope springs provide not only stiffness, but also contribute to dry damping due to friction between the steel wires or between the individual strands or threads of the wire rope. Such springs are also referred to as metal cable- or metal fiber shock absorbers. Alternatively or additionally, for example, conventional coil springs are used, which are preferably installed so that they are subjected to tension and/or compression in the longitudinal direction.

Furthermore, it is expedient to use dissipative elements or dampers, which contribute to the damping of the system oscillations—in addition to the intrinsic damping of the spring elements. The inventors have recognized that the viscous dampers usually used for this purpose constitute a danger when used on the upper side of a switch cabinet. Namely, under unfavourable circumstances, such a damper could leak and release a viscous damping liquid, which is frequently toxic, flammable and/or electrically conductive—all highly undesirable properties in the event of its release and in particular, its entry into the interior of the switch cabinet. In order to avoid such risks, exclusively friction-based dampers are used in the oscillation damper according to the present disclosure. Such dry dampers consume the oscillation energy by sliding friction between two dry friction surfaces and are, in contrast to viscous dampers, also maintenance-free for many years.

In particular, for this purpose, friction pads or friction linings are attached to the supporting structure of the oscillation damper at/on which the oscillating masses are mounted in a sliding manner. This relates to the central oscillating mass and, if necessary, also the peripheral oscillating masses. By selectively applying a contact pressure by means of an associated, preferably spring-loaded clamping device the friction can be increased significantly above the value attainable by the dead weight of the masses and above all can be set in a targeted manner.

A further advantage of the oscillation damper described here is its compact design, which is adapted to the geometry of a switch cabinet. It thus fits without lateral overlay on the ceiling wall at the upper end, and it nevertheless offers the oscillating masses enough space for a deflection of a few centimetres from the resting position.

BRIEF DESCRIPTION OF THE DRAWINGS

An embodiment of the invention is described in detail below by means of drawings.

DETAILED DESCRIPTION

Identical or identically acting parts are provided in all figures with the same reference numerals.

Figure 1:
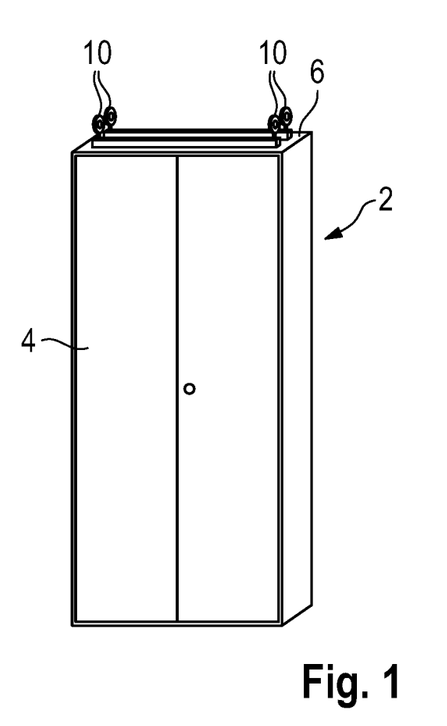
FIG. 1 shows a perspective view of a switch cabinet.

FIG. 1 shows a perspective view of a switch cabinet 2 of conventional design in an operating position with a substantially cuboid outer contour. In its interior the switch cabinet 2 accommodates, for example, a number of electrical or electronic components. A number of doors 4 are located in one of the side walls of the switch cabinet in order to allow access to the interior from the outside as required.

Figure 2:
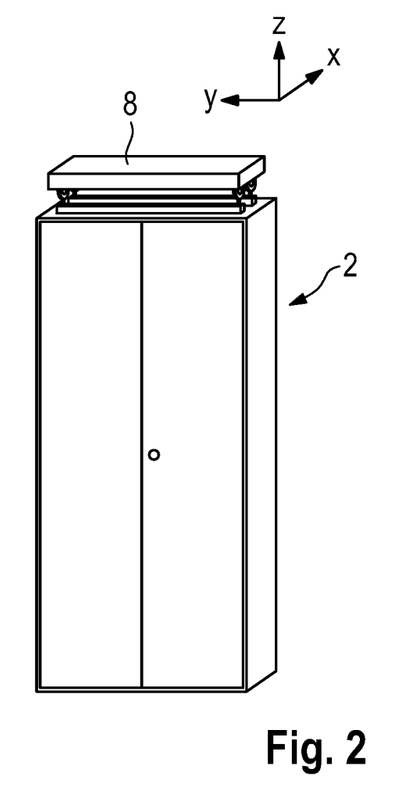
FIG. 2 shows the switch cabinet according to FIG. 1 with an oscillation damper mounted on its upper side, shown here only schematically.

According to an embodiment of the present invention, an oscillation damper 8, indicated only schematically in FIG. 2, and which is supposed to damp seismic oscillations acting on the components arranged in the interior in the event of an earthquake or other oscillations, is fastened to the upper side of the rectangular ceiling wall 6 or ceiling plate of the switch cabinet 2, oriented horizontally in the operating position. In the example shown here the fastening of the oscillation damper 8 is carried out with the aid of four eyelet-shaped holding elements 10 present in each case near the corners of the upper side of the ceiling wall 6, which are usually present for lifting the switch cabinet 2 by a lifting device. The fastening can also, of course, take place in other ways. In an alternative variant the oscillation damper 8 can be arranged in the interior of the switch cabinet 2—preferably if possible high up.

The transverse- and the longitudinal direction of the rectangular ceiling wall 6 define a right-angled x-y coordinate system, to which reference is made below.

Figure 4:
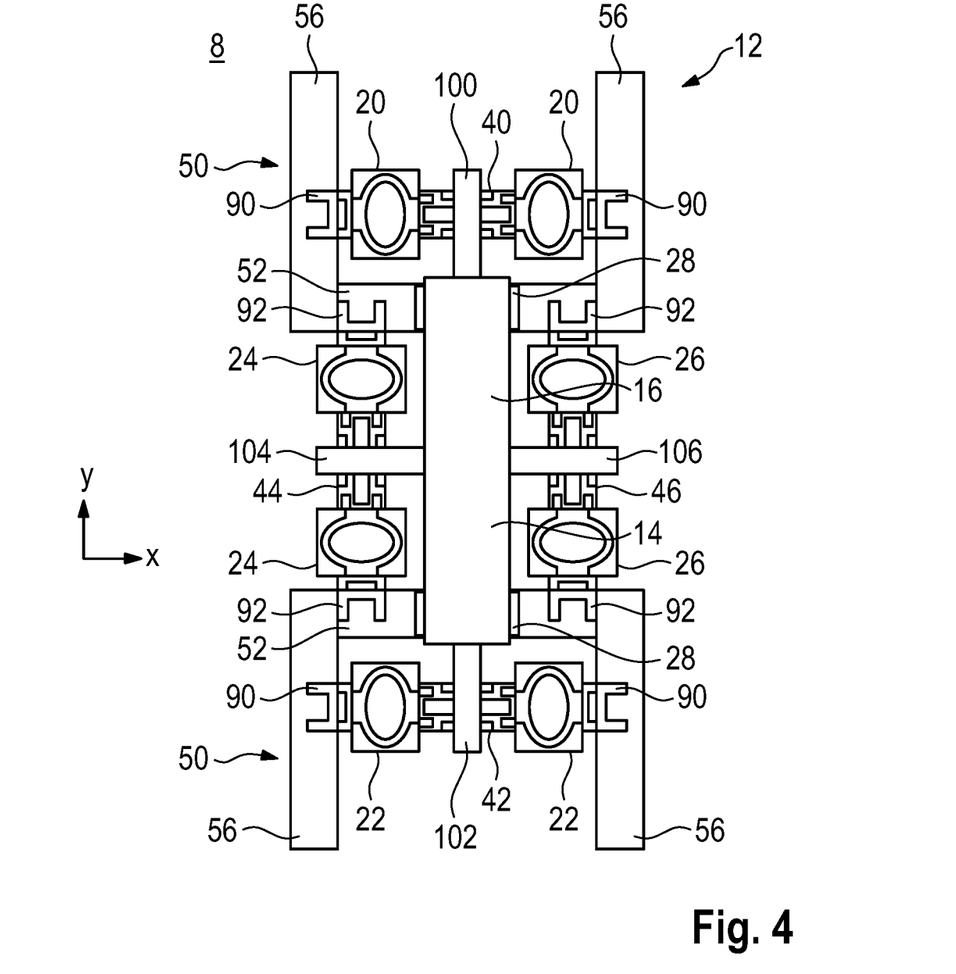
FIG. 4 shows a top view from above of the oscillation damper as a whole.

In FIG. 4 a preferred embodiment of the oscillation damper 8 is depicted in a top view from above. The oscillation damper 8 has a rectangular outline which is matched to the contour of the ceiling wall 6 of the switch cabinet 2, the longitudinal- and transverse direction of which in the installation position coincide with the longitudinal- and transverse direction of the ceiling wall 6 of the switch cabinet 2. In this respect, in the installation position the transverse direction corresponds with the x-direction and the longitudinal direction with the y-direction in the above-defined coordinate system.

Figure 3:
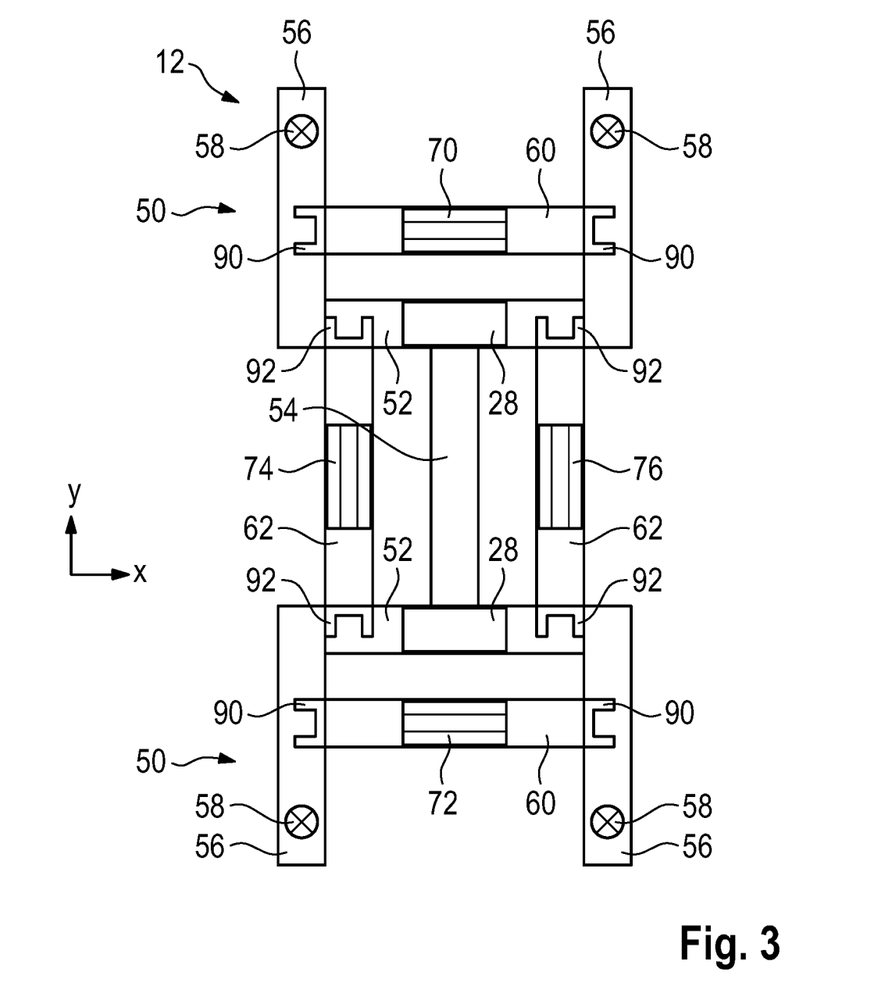
FIG. 3 shows a top view from above of a support frame of the oscillation damper according to an embodiment of the present invention.

Essential components of the oscillation damper 8 are a rigid supporting structure 12 depicted in isolation in FIG. 3, which in the installation position is connected in the described manner to the ceiling wall 6 of the switch cabinet 2, and a central oscillating mass 14, visible in FIG. 4, which is mounted in an oscillating manner on the supporting structure 12. The central oscillating mass 14 has a central body 16 of elongated shape, for example, a cuboid, which is oriented along the y-direction, thus parallel to the longitudinal side of the ceiling wall 6 of the switch cabinet 2. The central oscillating mass 14 is mounted in/at/on the supporting structure 12 in such a manner that, with appropriate force application, it is deflected from a resting position both in the x- as well as in the y-direction counter to a resetting force brought about by spring elements 20, 22, 24, 26 and then returns to said resting position. In other words, the central oscillating mass 14 can move in both directions relative to the supporting structure 12 and can perform an oscillation around the resting position. The maximum deflection from the resting position (adjustment path) is limited, for example, by stops, which are expediently attached or formed on the supporting structure 12 itself. Alternatively, a limitation can also be realized by the realizable spring paths themselves.

In a variant, the supporting structure 12 can also be completely or partially integrated into the switch cabinet.

Due to the type of bearing described further in detail below, in the present example no tilting or rotation of the central oscillating mass 14 can take place relative to the longitudinal orientation present in the resting position. In other words, the longitudinal axis of the central body 16 cannot be rotated out of the y-direction, so that no torsional oscillation can be excited. However, in principle, other bearings are also conceivable, in which a torsion is possible.

Already, by the spring elements 20, 22, 24, 26 themselves and their immanent stiffness a damping of the oscillation is realized. A targeted amplification of the damping is achieved by mounting the central oscillating mass 14 in a sliding manner on the supporting structure 12 (alternatively on the ceiling wall 6 of the switch cabinet 2), wherein advantageously the contact surfaces as a result of their surface properties form friction surfaces with defined coefficients of friction. For example, friction linings or friction pads 28 can be used here. This is depicted exemplarily in FIG. 3 or 4. Friction linings or friction pads 28 are attached to the upper side of the supporting structure 12, on which the central body 16 of the central oscillating mass 14 rests in a sliding manner.

Figure 6:
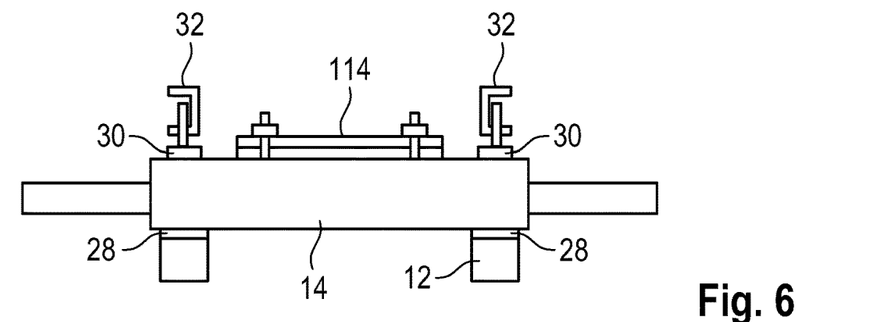
FIG. 6 shows a side view of an oscillating mass of the oscillation damper with an associated clamping device.

In an advantageous embodiment, which is indicated in FIG. 6, friction linings or friction pads 30 are also present, which bear on the upper side of the central body 16 and press on it from above. The contact pressure is advantageously adjustable by at least one associated adjustable clamping device 32. In other words, the central body 16 is clamped between the upper friction pads 30 and the lower friction pads 28 and is thus subjected to a defined adjustable friction force, so that the oscillation damping can be adjusted in a targeted manner. For a uniform force distribution a plurality of such clamping devices can be present.

In order to enable an even better adjustment of the oscillation damping taking into account the generally different oscillation modes for the x-direction and the y-direction, in addition to the central oscillating mass 14 further oscillating masses are present. A first group of peripheral oscillating masses 40, 42 is namely coupled to the previously described system in such a manner that the respective peripheral oscillating mass 40, 42 forcibly participates in the movement of the central oscillating mass 14 in the x-direction, however, is movable within a predetermined adjustment path in the y-direction relative to the central oscillating mass 14. The movement in the x-direction is damped by associated spring elements 20, 22. In a particularly advantageous but not absolutely necessary design, these are those spring elements, which also damp the movement of the central oscillating mass 14. For a second group of peripheral oscillating masses 44, 46, with which the spring elements 24, 26 are associated, the same applies by exchanging the roles of the x- and y-direction.

In other words, in the preferred design variant the central oscillating mass 14 is not directly connected by means of spring elements with the supporting structure 12. Rather, a resilient coupling of the central oscillating mass 14 with the supporting structure 12 is realized exclusively indirectly by means of those spring elements 20, 22, 24, 26, which, on the one hand, are connected to the peripheral oscillating masses 40, 42, 44, 46 and, on the other hand, to the supporting structure 12. The peripheral oscillating masses 40, 42, 44, 46 are therefore connected or coupled directly by means of the spring elements 20, 22, 24, 26 with the supporting structure 12. If the central oscillating mass 14 is moved, for example, in the x-direction, it takes with it the associated peripheral oscillating masses 40, 42 coupled rigidly with it in this direction, which then are deflected counter to the effective resetting force of the springs 20, 22. The same applies in the y-direction.

By means of the system consisting of central oscillating mass 14 and peripheral oscillating masses 40, 42, 44, 46 and the associated spring elements 20, 22, 24, 26 an optimized adaptation of the damping to the different natural frequencies of the switch cabinet 2 can be made in the x- and y-direction. Since the central oscillating mass 14 assumes a damping function for both directions, the weight of the peripheral oscillating masses 40, 42, 44, 46 used to a certain extent for fine tuning can as a rule be significantly smaller than the weight of the central oscillating mass 14.

In the present example, advantageously—in accordance with the selected terms—the central oscillating mass 14 lies inside, while the peripheral oscillating masses 40, 42, 44, 46 are arranged further outside. However, in principle, other configurations are also conceivable, for example, with small secondary oscillating masses with respectively one degree of freedom within a large primary oscillating mass with two degrees of freedom.

In the following, some details of the particularly advantageous implementation of the oscillation damper 8 according to the present disclosure depicted in the drawings are indicated:

The supporting structure 12 depicted in FIG. 3 in the top view from above, also referred to as a rack or frame, has two U-shaped extension arms 50, the openings of which are facing away from each other. The two U-shaped extension arms 50 lie in the installation position in a common horizontal plane and are rigidly connected to one another at the respective base 52 by a central support 54 oriented along the y-direction. This part of the supporting structure 12 is formed from steel profiles, preferably square profiles with a preferably square cross section. The fastening points 58 are located, if necessary, with suitable fastening means to the switch cabinet 2, at the ends of the legs 56 of the U-shaped extension arm 50 oriented along the y-direction. At the upper side of the steel profiles the friction linings or friction pads 28, on which the central oscillating mass 14 rests in a sliding manner, are located at a suitable place, here on the respective base 52 of the U-shaped extension arm 50.

Figure 5:
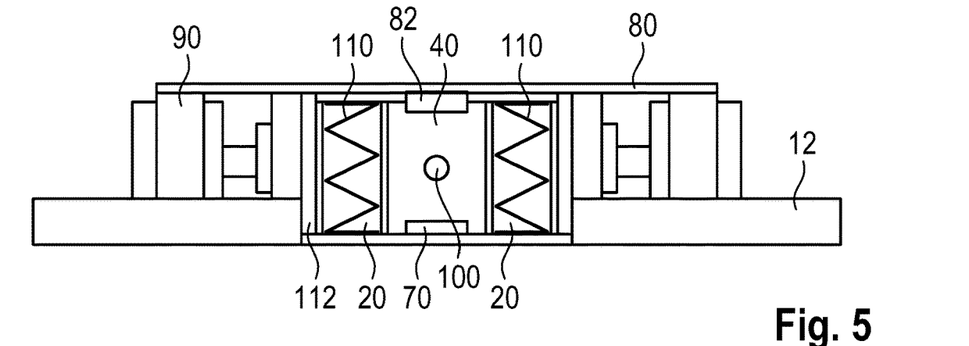
FIG. 5 shows a side view of the oscillation damper.

Furthermore, the legs 56 of the respective U-shaped extension arm 50 are connected with each other by a flat profile 60 lying there-between and oriented along the x-direction. In analogous manner, flat profiles 62 extending parallel to the central support 54 are arranged between the two U-shaped extension arms 50. On the flat profiles 60, 62, in each case rail-like guiding elements 70, 72, 74, 76 are formed for the peripheral oscillating masses 40, 42, 44, 46, for example, in the form of grooves, slots or elevations (see further below). The possible directions of movement of the peripheral oscillating masses 40, 42, 44, 46 predetermined by the guiding elements 70, 72, 74, 76 are indicated in FIG. 3 schematically by longitudinal grooves. Specifically, the peripheral oscillating masses 40, 42 can be moved in the x-direction and the peripheral oscillating masses 44, 46 in the y-direction. According FIG. 5 additional guiding elements 82 in appropriate alignment can be provided at the underside of the cover plate 80 explained further below in detail. If necessary, the bottom-side guiding elements can also be dispensed with and instead exclusively cover-side guiding elements can be provided.

Figure 9:
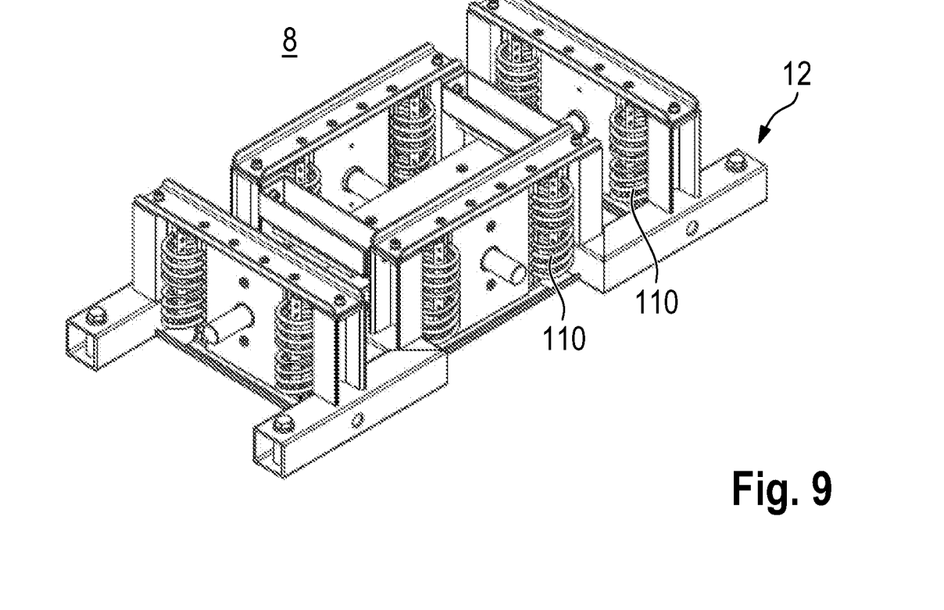
FIG. 9 shows a perspective view of the oscillation damper.

Finally, the supporting structure 12 has a plurality of vertical supports 90, 92, which project perpendicularly upwards in the manner of a column from the aforementioned horizontal plane. In particular, such a vertical support 90 is attached to each leg 56 of the U-shaped extension arms 50. In addition, such a vertical support 92 is attached to the base 52 of the U-shaped extension arm 50 in each case between the friction pad 28 and the leg 56 lying further to the outside. Overall, the vertical supports 90, 92 are arranged symmetrically to the two central axes of the supporting structure 12. They consist preferably of steel profiles, in particular U-profiles. As is described below, the vertical supports 90, 92 form fastening- or anchoring points for the spring elements 20, 22, 24, 26 damping the movement of the oscillating masses. In addition, at their ends projecting upwards they form support- and fastening points for a cover plate 80 horizontally oriented in the installation position, which cover plate prevents the oscillating masses from inadvertently jumping out of the horizontal plane upwards. Instead of a flat cover plate 80, as indicated in FIG. 9, a plurality of flat profiles or the like can form the termination of the device upwards.

The supports of the supporting structure 12 consist preferably of metallic materials and are welded together at the contact points, so that a stable and torsion-resistant construction is present. Steel is offered as the preferred material, but also, for example, aluminum, in particular, when weight reduction is desired. Alternatively, composites can be considered.

As can be seen in FIG. 4, the central oscillating mass 14 is oriented along the longitudinal axis, therefore in the y-direction of the supporting structure 12 and is mounted on the friction pads 28 with play both in the longitudinal—as well as in the transverse direction. On its two end faces the central oscillating mass 14 in each case has an extension oriented in the y-direction, integrally formed or firmly connected with the central body 16, which serves as a support and rail-like guiding element 100, 102—here in the form of a round rod—for a peripheral oscillating mass 40, 42. The peripheral oscillating mass 40, 42 in each case has an annular shape and is mounted with low play in a sliding manner or by means of ball bearings in a rolling manner on the guiding element 100. In this way, it can be moved in the y-direction within a path distance defined by the length of the guiding elements 100, 102 relative to the central oscillating mass 14, but is coupled in the x-direction to the movement of the central oscillating mass 14. Advantageously, the respective peripheral oscillating mass 40, 42 rests on the bottom-side in a sliding manner on a guiding element 70, 72, which is present at/on the flat profile 60. These guiding elements 70, 72 are provided and oriented in such a manner that the already described degrees of freedom of the movement are supported.

Furthermore, the central oscillating mass 14 has extensions projecting laterally along the x-direction and forming supports and guiding elements 104, 106, on which extensions in an analogous manner to the above description peripheral oscillating masses 44, 46 are also mounted in a sliding manner. These peripheral oscillating masses 44, 46 can thereby be moved in the x-direction relative to the central oscillating mass 14, while in the y-direction they are coupled to the movement of the central oscillating mass 14. On the bottom side the respective peripheral oscillating mass 44, 46 rests in a sliding manner on a guiding element 74, 76 on the flat profile 62. The previous description for the first group of peripheral oscillating masses 40, 42 applies here analogously.

As already mentioned, a reset of the oscillating masses into their resting position and a damping of the oscillation by a plurality of spring elements 20, 22, 24, 26 supported on the supporting structure is provided. The preferred spring arrangement is elucidated in detail below.

First, each of the peripheral oscillating masses 40, 42, movable by the guiding elements 70, 72 in the x-direction and blocked in the y-direction, is connected via two outwardly directed spring elements 20, 22 with the two legs 56 of the U-shaped extension arm 50. The respective spring element 20, 22 is preferably a vertically oriented elongated spring 110 of preferably helical shape, in particular a wire rope spring, which, on the one hand, is fastened to the peripheral oscillating mass 40, 42 and, on the other hand, to the vertical support 90 projecting upwards from the leg 56 of the U-shaped extension arm 50, as can easily be seen in the perspective representation according to FIG. 9 or in the side view according to FIG. 5. If necessary, connecting plates 112 acting as adapters with variable thickness can lie between the springs 110 and the vertical supports 90. That is, the springs 110 are stressed, viewed here in cross section, by the oscillations in the radial direction therefore compressed or pulled apart. Each of the peripheral oscillating masses 40, 42 can thus move counter to the resetting force of the spring elements 20, 22 relative to the supporting structure 12 by a certain path distance in the x-direction, specifically together with the central oscillating mass 14. In the y-direction, in contrast, the central oscillating mass 14 can move independently of and relative to the peripheral oscillating masses 40, 42.

At the same time, the spring elements 20, 22 provide for a reset and damping of the oscillations of the central oscillating mass 14 in the x-direction, for when this is deflected in the x-direction, the deflection is transmitted via the peripheral oscillating masses 40, 42, lying there-between, to the spring elements 20, 22. Due to the geometry of the arrangement, in which the central oscillating mass 14 to a certain extent is clamped by means of the spring elements 20, 22 between the two legs 56 of the U-shaped extension arm 50, a path restriction of the central oscillating mass 14 is also ultimately realized in the x-direction.

The above explanations apply analogously to the second group of peripheral oscillating masses 44, 46, which in each case are clamped by means of spring elements 24, 26 between the two supports on the base 52 of the U-shaped extension arm 50. The anchoring of the spring elements 24, 26 to the supporting structure 12 is carried out in this case on the vertical supports 92, which project upwards from the base supports. Thus, a reset and a damping takes place and ultimately also a path restriction of the oscillation of the central oscillating mass 14 in the y-direction. Due to the sliding bearings of the peripheral oscillating masses 44, 46 on the guiding elements 104, 106 projecting in the x-direction from the central body 16, it is ensured that the central oscillating mass 14 together with the peripheral oscillating masses 44, 46 can move in the y-direction. The peripheral oscillating masses 44, 46 can thus oscillate together with the central oscillating mass 14 in the y-direction, wherein these oscillations are damped by the spring elements 24, 26 and by the friction pads 28. In contrast, in the x-direction, the central oscillating mass 14 can move independently of and relative to the peripheral oscillating masses 44, 46.

In the described spring arrangement the spring elements 20, 22, 24, 26 are arranged between the supporting structure 12 and the peripheral oscillating masses 40, 42, 44, 46; they are not directly fastened to the central oscillating mass 14. In general, however, there can also be spring elements, which, on the one hand, are fastened to the supporting structure 12 and, on the other hand, directly to the central oscillating mass 14. Such spring elements can be present in particular in addition to the above described spring arrangement.

Figure 7:
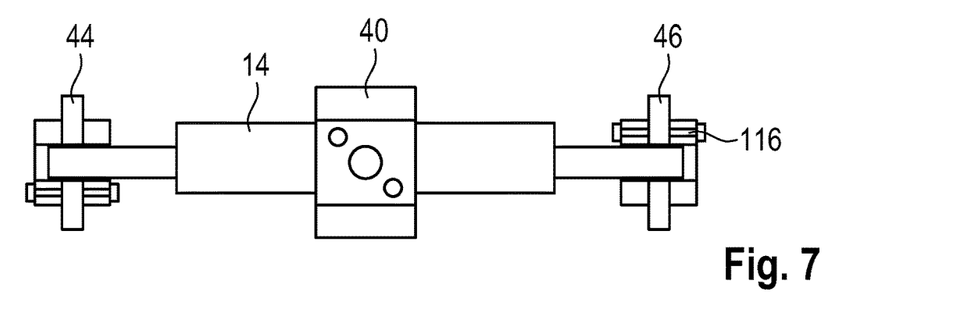
FIG. 7 shows a side view of an oscillating mass of the oscillation damper with additional masses fastened to it.

As required, additional masses 114, 116 or trimming masses can be attached both to the central oscillating mass 14 as well as to all or selected peripheral oscillating masses 40, 42, 44, 46, as is schematically depicted in FIGS. 6 and 7. The central oscillating mass 14 and the peripheral oscillating masses 40, 42, 44, 46 are advantageously provided with corresponding, preferably detachable fastening means.

Figure 8:
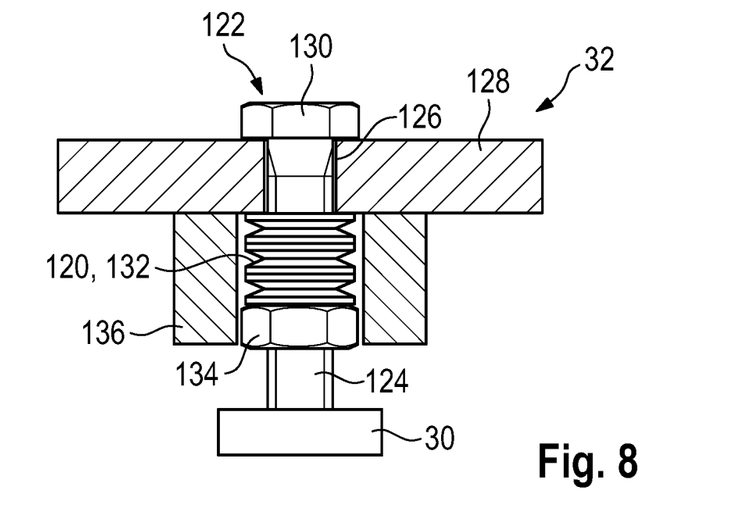
FIG. 8 shows a sectional view of the clamping device from FIG. 6 in detail.

An example of the already mentioned clamping device 32 for setting the defined friction forces on the oscillating masses is depicted in FIG. 8. A friction pad 30 pressing from above on the respective mass is held here by a spring element 120 supported on a part of the supporting structure 12 under the desired tension. In the present example, the spring element 120 is a disc spring or a disc spring assembly, but of course, other types of springs can also be used, for example, coil springs (compression springs) or spring rings. By means of an adjusting screw 122 the pretension can advantageously be adjusted and changed in a targeted manner.

In the present case, the screw shaft 124 of the adjusting screw 122 provided with a thread passes through a borehole 126 having play in a support 128 of the supporting structure 12. At the top, the screw head 130 of the adjusting screw 122 rests on the support 128. Underneath the support 128, a disc spring 132 is clamped between the support 128 and the nut 134 screwed onto the screw shaft 124 and presses the adjusting screw 122 downwards. A collar 126 projecting downwards from the support 128 blocks the nut 134 against rotation. Thus, by rotating the screw head 130, the screw shaft 124 can move up and down relative to the stationary nut 134 and the spring pretension can be varied.

The described system offers a variety of adjustment possibilities, namely by selecting and adjusting the oscillating masses and the spring types, spring paths, spring constants, etc. Moreover, the friction of the oscillating system can be influenced in a targeted manner by selecting the friction surfaces and the contact pressure (pretension). In particular, the oscillation properties can be set differently (differentially) in the x- and y-direction, so that different modes of the system to be damped associated with these directions, here of the switch cabinet, can be taken into account.

Finally, purely by way of example, a pair of typical dimensions of the oscillation damper 8 are indicated for the preferred application in the case of a switch cabinet 2:

The central oscillating mass 14 preferably has a weight in the range of 10 to 30 kg, the peripheral oscillating masses 40, 42, 44, 46 in each case preferably have a weight in the range of 1 to 10 kg. The preferred material for the oscillating masses is steel. The maximum deflection of the central oscillating mass 14 (adjustment path) is advantageously at least a few centimetres in each of the two directions. Transverse- and longitudinal dimensions of the oscillation damper 8 are adapted so that they fit the dimensions of the ceiling wall 6 of the switch cabinet 2. Typically, these dimensions are in the range of 0.4 to 1 m. The height of the oscillation damper 8 is in the range of 20 cm to 30 cm. The spring elements 20, 22, 24, 26 have a stiffness—this, together with the oscillating masses, produces a natural frequency for the system in the defined range of 5 to 30 Hz. These spring elements can advantageously be compressed or stretched a few centimetres. The friction pad-materials can preferably contain coefficients of friction in the range of 0.05 to 0.2.

As can be seen from the entire previous description, the oscillation damper according to the present disclosure is preferably a purely passive oscillation damper, in which the oscillating masses oscillate in a damped manner in the event of a corresponding seismic excitation, but themselves have no drive means in the form of actuators/motors or the like or are coupled thereto. The oscillation damper according to the present disclosure therefore requires no control and no energy supply for operation.

As already mentioned, a preferred application of the oscillation damper according to the present disclosure is in the field of switch cabinets, in particular electrical or I&C switch cabinets of nuclear power plants. Of course, applications of the oscillation damper according to the present disclosure can also be considered in other areas, for example, in buildings.

LIST OF REFERENCE SIGNS 2 switch cabinet
4 door
6 ceiling wall
8 oscillation damper
10 holding element
12 supporting structure
14 central oscillating mass
16 central body
20 spring element
22 spring element
24 spring element
26 spring element
28 friction pad
30 friction pad
32 clamping device 40 peripheral oscillating mass
42 peripheral oscillating mass
44 peripheral oscillating mass
46 peripheral oscillating mass
50 extension arm
52 base
54 support
56 leg
58 fastening point
60 flat profile
62 flat profile
70 guiding element
72 guiding element
74 guiding element
76 guiding element
80 cover plate
82 guiding element
90 vertical support
92 vertical support
100 guiding element
102 guiding element
104 guiding element
106 guiding element
110 spring
112 connecting plate
114 additional mass
116 additional mass
120 spring element
122 adjusting screw
124 screw shaft
126 borehole
128 support
130 screw head
132 disc spring
134 nut
136 collar

What is claimed is:

1. A passive oscillation damper comprising:
a supporting structure having a longitudinal direction and a transverse direction, the transverse direction being transverse to the longitudinal direction;
a central oscillating mass supported by first spring elements so as to be configured to oscillate in the longitudinal direction and in the transverse direction;
at least one first peripheral oscillating mass is mounted on the central oscillating mass so as to be slidable in the longitudinal direction and to be movable relative to the central oscillating mass; and
at least one second peripheral oscillating mass mounted on the central oscillating mass so as to be slidable in the transverse direction and to be movable relative to the central oscillating mass,
each of the at least one first peripheral oscillating mass and the at least one second peripheral oscillating mass being fastened to the supporting structure by at least one of the first spring elements or by at least one second spring element.

2. The oscillation damper according to claim 1, wherein the at least one first peripheral oscillating mass is coupled to the central oscillating mass so as to be fixed in the transverse direction, and wherein the at least one second peripheral oscillating mass is coupled to the central oscillating mass so as to be fixed in the longitudinal direction.

3. The oscillation damper according to claim 1, wherein the at least one first peripheral oscillating mass is supported so as to be configured to oscillate in the transverse direction relative to the supporting structure, and wherein the at least one second peripheral oscillating mass is supported so as to be configured to oscillate in the longitudinal direction relative to the supporting structure.

4. The oscillation damper according to claim 1, wherein the central oscillating mass is coupled only indirectly in a resilient manner to the supporting structure by the first spring elements which are directly coupled to the respective at least one first and the at least one second peripheral oscillating masses.

5. The oscillation damper according to claim 1, wherein the first and second spring elements are each a spring which is arranged in such a manner that the spring is stressed normal to a longitudinal direction of the spring.

6. The oscillation damper according to claim 5, wherein the spring is formed from wire rope.

7. The oscillation damper according to claim 1, further comprising guiding elements configured for preventing a rotation of the central oscillating mass relative to the supporting structure.

8. The oscillation damper according to claim 1, wherein the central oscillating mass has a central body and guiding elements which project therefrom to both sides in the transverse and longitudinal direction, and on which the associated peripheral masses slide.

9. The oscillation damper according to claim 1, wherein the at least one first peripheral oscillating mass includes two first peripheral oscillating masses and the at least one second peripheral oscillating mass includes two second peripheral oscillating masses.

10. The oscillation damper according to claim 9, wherein the two first peripheral oscillating masses the two second peripheral oscillating masses form a cross-shaped arrangement, with the central oscillating mass in the centre.

11. The oscillation damper according to claim 1, wherein an oscillating system comprising the central oscillating mass and the at least one first and at least one second peripheral oscillating masses is damped by dry dampers.

12. The oscillation damper according to claim 11, wherein at least one of the dry dampers has a friction pad resting against the central oscillating mass.

13. The oscillation damper according to claim 12, wherein the friction pad is pressed against the central oscillating mass by an adjustable clamping device.

14. The oscillation damper according to claim 1, wherein the central oscillating mass is heavier than each of the at least one first and the at least one second peripheral oscillating masses.

15. The oscillation damper according to claim 1, wherein an oscillating system comprising the central oscillating mass and the at least one first and at least one second peripheral oscillating masses is damped without viscous dampers.

16. The oscillation damper according to claim 1, wherein the central oscillating mass and/or the at least one first and at least one second peripheral oscillating masses comprise seatings or fasteners for additional masses.

17. The oscillation damper according to claim 1, wherein each of the at least one first and at least one second peripheral oscillating masses is fastened to the supporting structure by two of the second spring elements.

18. The oscillation damper according to claim 1, wherein the oscillation damper is configured for a switch cabinet.

19. A switch cabinet comprising:
a passive oscillation damper comprising:
a supporting structure having a longitudinal direction and a transverse direction, the transverse direction being transverse to the longitudinal direction;

a central oscillating mass supported by first spring elements so as to be configured to oscillate in the longitudinal direction and in the transverse direction;

at least one first peripheral oscillating mass is mounted on the central oscillating mass so as to be slidable in the longitudinal direction and to be movable relative to the central oscillating mass; and at least one second peripheral oscillating mass mounted on the central oscillating mass so as to be slidable in the transverse direction and to be movable relative to the central oscillating mass, each of the at least one first peripheral oscillating mass and the at least one second peripheral oscillating mass being fastened to the supporting structure by at least one of the first spring elements or by at least one second spring element.

20. The switch cabinet according to claim 19, wherein the oscillation damper is adapted to different oscillation frequencies in the longitudinal direction and the transverse direction by the central oscillating mass and/or the at least one first and at least one second peripheral oscillating masses and/or the first and second spring elements and/or dry dampers and/or additional masses.

* * * * *